United States Patent
West et al.

(10) Patent No.: US 10,867,776 B2
(45) Date of Patent: Dec. 15, 2020

(54) PHYSICAL VAPOR DEPOSITION IN-CHAMBER ELECTRO-MAGNET

(71) Applicant: Applied Materials, Inc., Santa Clara, CA (US)

(72) Inventors: Brian T. West, San Jose, CA (US); Michael S. Cox, Gilroy, CA (US); Miroslav Gelo, Oakley, CA (US); Dinkesh Huderi Somanna, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 181 days.

(21) Appl. No.: 15/975,400

(22) Filed: May 9, 2018

(65) Prior Publication Data
US 2019/0348259 A1 Nov. 14, 2019

(51) Int. Cl.
| | | |
|---|---|---|
| *H01J 37/32* | (2006.01) | |
| *H01J 37/34* | (2006.01) | |
| *C23C 14/56* | (2006.01) | |
| *H01L 21/285* | (2006.01) | |
| *C23C 14/04* | (2006.01) | |

(52) U.S. Cl.
CPC ........ *H01J 37/3266* (2013.01); *C23C 14/046* (2013.01); *C23C 14/568* (2013.01); *H01J 37/32009* (2013.01); *H01J 37/32623* (2013.01); *H01J 37/3405* (2013.01); *H01L 21/2855* (2013.01)

(58) Field of Classification Search
None
See application file for complete search history.

(56) References Cited

U.S. PATENT DOCUMENTS

| | | | | |
|---|---|---|---|---|
| 4,385,979 A | * | 5/1983 | Pierce | H01J 7/3405 204/298.09 |
| 5,824,607 A | * | 10/1998 | Trow | B08B 7/0035 438/732 |
| 7,407,565 B2 | | 8/2008 | Wang et al. | |
| 7,804,040 B2 | | 9/2010 | Brown et al. | |
| 2004/0094402 A1 | * | 5/2004 | Gopalraja | C23C 14/345 204/192.12 |
| 2010/0155223 A1 | * | 6/2010 | Gung | C23C 14/046 204/192.3 |
| 2014/0291140 A1 | | 10/2014 | Kouznetsov | |

FOREIGN PATENT DOCUMENTS

| | | | | |
|---|---|---|---|---|
| CN | 1950538 A | | 4/2007 | |
| WO | WO 00/03055 | * | 1/2000 | H01J 37/321 |

OTHER PUBLICATIONS

International Search Report and Written Opinion for PCT/US2019/027955, dated Aug. 9, 2019.
TW Search Report dated Nov. 27, 2019 for Application No. 108113710.

* cited by examiner

*Primary Examiner* — John J Brayton
(74) *Attorney, Agent, or Firm* — Patterson + Sheridan, LLP

(57) ABSTRACT

A PVD chamber deposits a film with high thickness uniformity. The PVD chamber includes a coil of an electromagnetic that, when energized with direct current power, can modify plasma in an edge portion of the processing region of the PVD chamber. The coil is disposed within the vacuum-containing portion of the PVD chamber and outside a processing region of the PVD chamber.

19 Claims, 6 Drawing Sheets

PHYSICAL VAPOR DEPOSITION IN-CHAMBER ELECTRO-MAGNET

BACKGROUND

Field

Embodiments of the present disclosure generally relate to semiconductor fabrication and, more particularly, to a physical vapor deposition in-chamber electromagnet.

Description of the Related Art

In the fabrication of semiconductor devices, physical vapor deposition (PVD) is a process employed for depositing a variety of different materials. As the miniaturization of semiconductor devices continues, the requirements for the various films that are included in such devices generally become more stringent.

Radio frequency (RF) filters, which are key components of wireless communication devices, are one example of semiconductor devices that continue to be miniaturized for better performance. With miniaturization, the deposition uniformity of the films that make up such filters must be tightly controlled. For instance, bulk acoustic wave (BAW) resonators enable precise filtering of the RF signals received from cell phone base stations by mobile phones. With a growing number of signals being received by smartphones (including cell, Wi-Fi, and GPS), and the crowding of available frequencies, BAWs must be highly frequency-selective to avoid slowdowns or interruptions in operation.

The resonant frequency of a BAW device is inversely proportional to the thickness of the piezoelectric layer in the BAW and of the electrodes above and below the piezoelectric layer. This relationship means that deposition uniformity of the piezoelectric and electrode layers is important to BAW device performance repeatability. For example, the target within-wafer uniformity for an aluminum nitride (AlN) piezoelectric layer can be on the order of 0.5%. By contrast, using conventional PVD techniques, achieving less than 1% within-wafer uniformity for deposited metal films is already a challenge.

Deposition within a PVD process chamber is controlled through a number of variables, including chamber vacuum level, composition of process gases, plasma density and uniformity, bias applied to the wafer, etc. In addition to the above variables, the uniformity and quality of a film deposited via PVD is also highly dependent on the geometry of the PVD process chamber, such as the magnetic profile, and configuration, of the magnetron rotating above the target, the shape of process kit components within the chamber, target-to-wafer spacing, and the like. However, with the exception of target-to-wafer spacing, such geometric factors are generally unchangeable without considerable time and cost to re-engineer some or all such components. Further, any solution based on redesigned process kit components is static, and cannot be tuned or otherwise modified for individual process chambers. As a result, improvements in film uniformity through chamber redesign is a time-consuming and expensive process.

In light of the above, there is a need in the art for systems and methods that enable improved uniformity of deposition during a PVD process.

SUMMARY

One or more embodiments described herein provide a PVD chamber that can deposit a film with high thickness uniformity. Specifically, the PVD chamber includes a coil of an electromagnetic that, when energized with direct current (DC) power, can modify plasma in an edge portion of the processing region of the PVD chamber. The coil is disposed within the vacuum-containing portion of the PVD chamber and outside a processing region of the PVD chamber.

According to various embodiments, a physical vapor deposition system comprises: a vacuum processing chamber comprising: a sputtering target; a substrate support disposed within the vacuum processing chamber configured to position a substrate proximate to the sputtering target; a deposition shield disposed within the vacuum processing chamber; a processing region disposed within the vacuum processing chamber and bounded by a surface of the target, a surface of the substrate support, and an inner surface of the deposition shield; and a coil portion of an electromagnet, wherein the coil portion is disposed within the vacuum processing chamber and outside the processing region.

According to various embodiments, a method of physical vapor deposition in a vacuum chamber comprises: positioning a substrate in a processing region of the vacuum chamber, wherein the processing region is disposed between a surface of a sputtering target of the vacuum chamber, a surface of a substrate support in the vacuum chamber, and an inner surface of a deposition shield disposed in the vacuum chamber; generating a plasma in a processing region; and when the plasma is present in the processing region, applying direct current (DC) power to a coil portion of an electromagnet, wherein the coil portion is disposed within the vacuum chamber and outside the processing region.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

Figure 1:
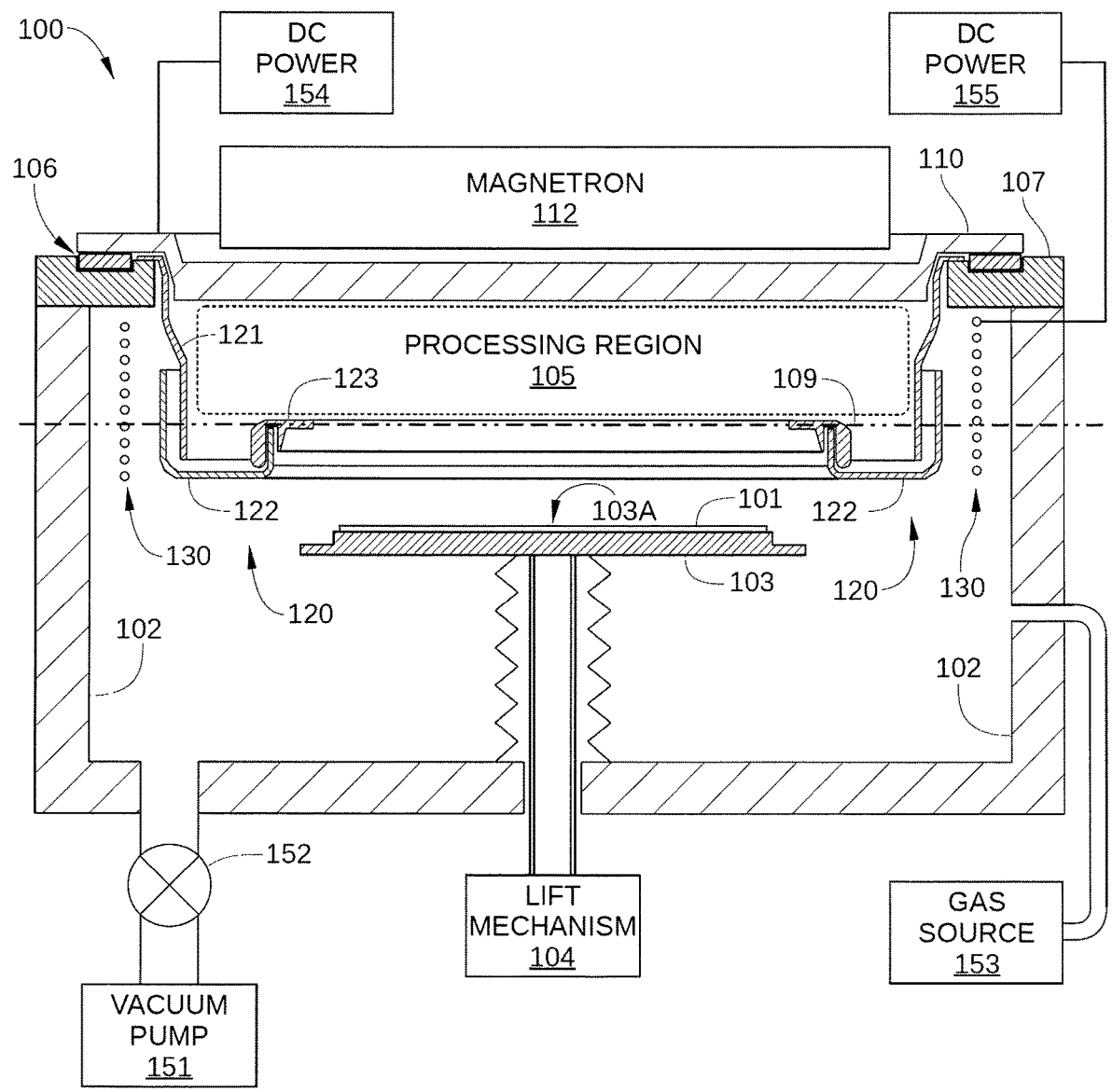
FIG. 1 is a schematic cross-sectional illustration of a physical vapor deposition (PVD) chamber, according to various embodiments of the present disclosure.

FIG. 1 is a schematic cross-sectional illustration of a physical vapor deposition (PVD) chamber 100, according to various embodiments of the present disclosure. PVD chamber 100 is configured to deposit material onto a substrate 101 as part of the process of manufacturing electronic circuits, such as integrated circuit chips and displays. More specifically, PVD chamber 100 deposits a material from sputtering target 110 onto substrate 101 during a PVD, or "sputtering," process, in which high-energy ions impact sputtering target 110, causing particles of target material to be ejected from sputtering target 110 and deposited as a film on the substrate 101. Examples of materials that can be deposited by PVD chamber 100 include, without limitation, various metals, such as aluminum (Al), copper (Cu), tungsten (W), molybdenum (Mo), tantalum (Ta), and/or metal compounds, such as tantalum nitride (TaN), tungsten nitride ($W_2N$, WN, or $WN_2$), titanium nitride (TiN), aluminum nitride (AlN), scandium aluminum nitride (ScAlN or $Sc_xAl_{1-x}N$), and the like.

PVD chamber 100 includes chamber walls 102. As shown, PVD chamber 100 further includes, disposed within chamber walls 102, a substrate support 103 coupled to a lift mechanism 104, one or more deposition shields 120, and a coil portion 130 of an electromagnet. PVD chamber 100 further includes the sputtering target 110 mounted on or coupled to chamber walls 102. In the embodiment illustrated in FIG. 1, sputtering target 110 is electrically separated from chamber walls 102 by an insulator 106 disposed on an adapter 107 that is mounted on the chamber walls 102. Together, sputtering target 110, deposition shields 120, and substrate support 103 (when lifted to a processing position proximate target 110) enclose a processing region 105 in which plasma is formed during a deposition process performed in PVD chamber 100.

PVD chamber 100 further includes one or more vacuum pumps 151 fluidly coupled to PVD chamber 100 via a respective valve 152, a gas source 153 fluidly coupled to PVD chamber 100, a DC power source 154 electrically coupled to sputtering target 110, and a DC power source 155 electrically coupled to coil portion 130. Vacuum pump(s) 151 are configured to produce a targeted level of vacuum during a deposition process performed on substrate 101 in PVD chamber 100. Gas source 153 is configured to provide one or more process gases during such a deposition process. DC power source 154 is electrically coupled to sputtering target 110 during the deposition process so that sputtering target 110 has a suitable charge for plasma to be generated in processing region 105. DC power source 155 is electrically coupled to coil portion 130 during the deposition process so that a magnetic field is generated in processing region 105 that can improve uniformity of deposition on substrate 101, as described in greater detail below. In some embodiments, substrate support 103 can also be coupled to a DC or radio frequency (RF) power source (not shown) to improve uniformity or other film characteristics of material deposited on substrate 101.

DC power source 155 can be any suitable power supply configured to deliver DC power to coil portion 130. In some embodiments, DC power source 155 is configured to output DC power at a constant power level to coil portion 130 during a PVD process. In other embodiments, DC power source 155 is configured to output timed pulses of DC power to coil portion 130. In addition, in some embodiments, DC power source 155 can be configured to selectively output DC power at different polarities. Thus, in such embodiments, DC power source 155 can output positive DC power in some situations and negative DC power in other situations, depending on commands or inputs from a controller associated with PVD chamber 100. As a result, the polarity of the magnetic field generated by coil portion 130 can be varied when beneficial to the PVD process.

In some embodiments, DC power source 155 is configured to output DC power at a variable power level to coil portion 130. Thus, the magnetic field generated by coil portion 130 can be varied in magnitude when beneficial to the PVD process. For example, in one such embodiment, DC power source 155 is configured as a programmable power supply that generates a variable DC output in response to a command, such as a command from a controller for the PVD chamber 100. The variable DC output can be implemented by DC power source 155 via pulsed DC outputs of different power amplitude. Further, the variable DC output can follow an output profile that changes as a function of time. For example, the variable DC output can follow a profile that includes a particular power ramp-up profile during a beginning period of the PVD process and a power ramp-down profile during an ending period of the PVD process. Alternatively or additionally, the variable DC output can vary with time according to any suitable function, including a step function, a sinusoidal function, or any other suitable time-varying function. Thus, in such an embodiment, a controller for PVD chamber 100 can initiate a particular variable DC output with a single command to DC power source 155. In other embodiments, DC power source 155 is configured as a controllable power supply configured to generate a particular DC output in response to a particular input value. In such embodiments, a controller associated with PVD chamber 100 can transmit inputs that can change in real time and thereby directly control the DC power output of DC power source 155 during a PVD process in PVD chamber 100.

Sputtering target 110 is a solid metal or other material to be deposited, and is sometimes coupled to and supported by a backing plate (not shown). In operation, sputtering target 110 is typically employed as a cathode and is negatively charged, for example by being electrically coupled to DC power source 154. In addition, a magnetron 112 is disposed outside PVD chamber 100 and proximate sputtering target 110, and is typically enclosed in a water-cooled chamber (not shown). Magnetron 112 rotates during a PVD process to trap electrons over the negatively charged sputtering target 110, increasing target sputtering rates, and thus creating higher deposition rates on the substrate 101.

Deposition shields 120 protect chamber walls 102 and other components within PVD chamber 100 from receiving deposition of sputtered material. In the embodiment illustrated in FIG. 1, deposition shields 120 include an upper shield 121 mounted on adapter 107, a lower shield 122, and a cover ring 123, but PVD chamber 100 can include any other technically feasible configuration of deposition shields or a single deposition shield without exceeding the scope of the present disclosure.

Coil portion 130 is a coil of an electromagnet that is disposed within PVD chamber 100 and outside of processing region 105. According to various embodiments, during a PVD process in PVD chamber 100, direct current (DC) power is applied to coil portion 130 to generate a magnetic field (not shown) that extends into processing region 105. As a result, the distribution and density of plasma in processing region 105 can be altered, thereby modifying the rate of deposition onto the surface of substrate 101. Specifically, because the magnetic field generated by coil portion 130 is most intense near the periphery of processing region 105 and of substrate 101, the biggest changes to deposition rate caused by the magnetic field occur near the circumference of substrate 101. Thus, center-to-edge uniformity issues of a film deposited on substrate 101 can be addressed by altering the intensity of the magnetic field generated by coil portion 130 by changing the current flowing therethrough.

Coil portion 130 can be any technically feasible conductive coil that is substantially centered about a center point 103A of substrate support 103, i.e., the distance from the center point 103A to the center of the coil portion 130 is substantially equal around the center point 103A. In some cases, the distance from the center point 103A to the center of the coil portion 130 can be offset so that the center point 103A is not the central axis of the coil portion 130, or the coil portion 130 may not be circular in plan view, i.e., from above. In these cases, the coil portion 130 architecture is modified to address non-uniformity of deposition across the substrate surface. For example, where the deposited thickness or other property of the sputter deposited field is offset from being symmetric about the center of the substrate, the magnetic field produced by coil portion can be offset in an opposite direction by physically displacing all, or part of the coil in the opposite direction. Likewise, where annular non-uniformities in thickness or other properties of the sputter deposited film on the substrate are present, changes in the current in the coil portion 130, or the spacial alignment of the coil portion with respect it the center point 103A, can be used to spread the annular region out or reduce its radial expanse. In some embodiments, coil portion 130 overlaps a plane 109 that corresponds to the location of substrate 101 when substrate support 103 positions substrate 101 in a processing position, i.e., the location of substrate 101 during a PVD process. Thus, in such embodiments, plane 109 passes through coil portion 130, as shown in FIG. 1. In the embodiment illustrated in FIG. 1, each turn of coil portion 130 is not in contact with other turns of coil portion 130. In other embodiments, the turns of coil portion 130 are in contact with one or more other turns of coil portion 130. The number of turns included in coil portion 130 is based on a target intensity of magnetic field to be generated by coil portion 130. Furthermore, the target intensity can be a function of multiple factors, including diameter of substrate 101, distance of coil portion 130 from processing region 105, magnitude of DC current applied to coil portion 130, duration of the PVD process, and the like. While the embodiment of coil portion 130 illustrated in FIG. 1 includes 10 turns, coil portion 130 can include any suitable number of turns, depending on at least the above factors. Thus, various configurations of coil portion 130 can be implemented in different embodiments of the disclosure, as described below in conjunction with FIGS. 2-5.

Figure 2:
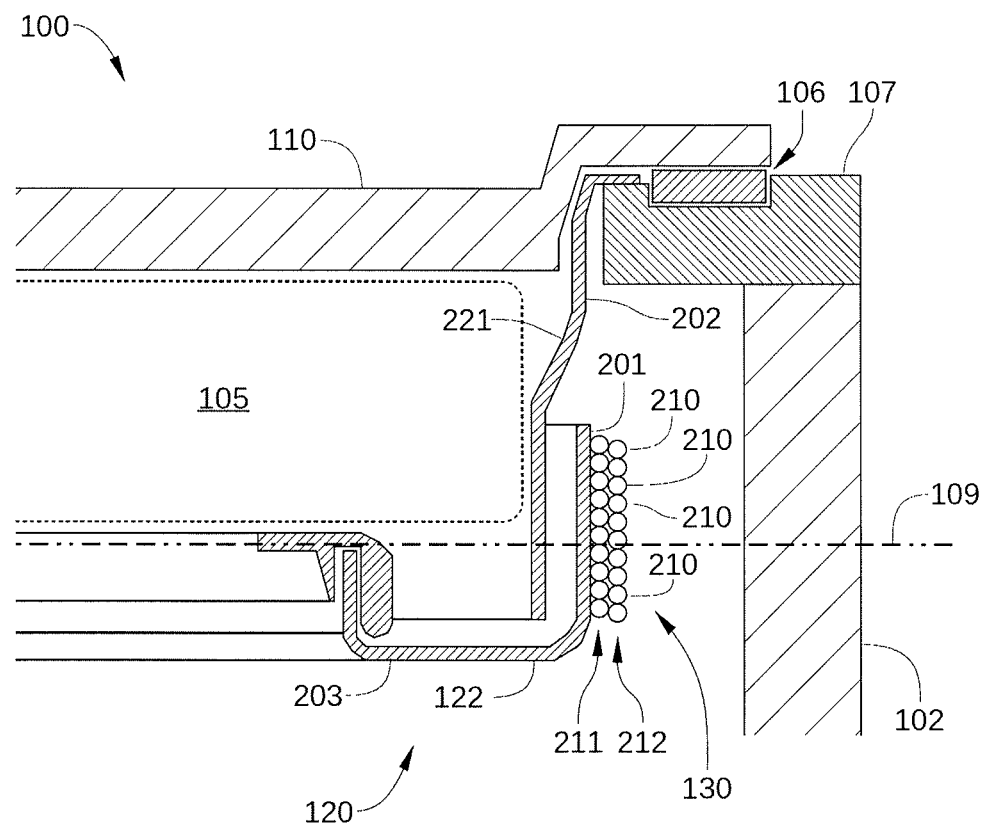
FIG. 2 is a schematic cross-sectional illustration of coil portion of an electromagnet, in which the coil portion is mounted on a surface of one of the deposition shields of the PVD chamber of FIG. 1, according to various embodiments of the present disclosure.

FIG. 2 is a schematic cross-sectional illustration of coil portion 130, in which coil portion 130 is mounted on a surface 201 of one of deposition shields 120 of PVD chamber 100, according to various embodiments of the present disclosure. In the embodiment illustrated in FIG. 2, coil portion 130 is mounted on the surface 201 of lower shield 122 facing the chamber wall 102, and thus surrounds the substrate support 103. As shown, coil portion 130 can be positioned on lower shield 122 to overlap plane 109, i.e., portions of the turns thereof lie on either side of plane 109. In addition, coil portion 130 can include multiple layers 211 and 212 of turns 210, here, first turns of a first radius and second turns of a different radius. In the embodiment illustrated in FIG. 2, coil portion 130 includes two layers 211 and 212, but in other embodiments, coil portion 130 can include more than two such layers or fewer than two layers of turns 210. Furthermore, in the embodiment illustrated in FIG. 2, turns 210 are formed with wire or other conductor that is circular in cross-section, but in other embodiments, turns 210 can be formed with wire or conductor that is square or rectangular in cross-section.

In some embodiments, coil portion 130 is mounted on any other suitable surface within PVD chamber 100 instead of surface 201 of lower shield 122. For instance, coil portion 130 can be mounted on a different surface of lower shield 122, or on a surface of any other deposition shield 120 that is outside of processing region 105. Thus, in alternative embodiments, coil portion 130 is mounted on an outer surface 202 of upper shield 121, on a lower surface 203 of lower shield 122, etc.

Because coil portion 130 of the electromagnet described herein is disposed within the vacuum-containing portion of PVD chamber 100, cooling of coil portion 130 is limited. As a result, the magnitude of DC power applied thereto by DC power source 155 can be limited due to the potential for overheating of coil portion 130 during longer duration recipes. In some embodiments, coil portion 130 is mounted on or within a structure in PVD chamber 100 that enables a cooling liquid to reduce heating of coil portion 130. One such embodiment is illustrated in FIG. 3.

Figure 3:
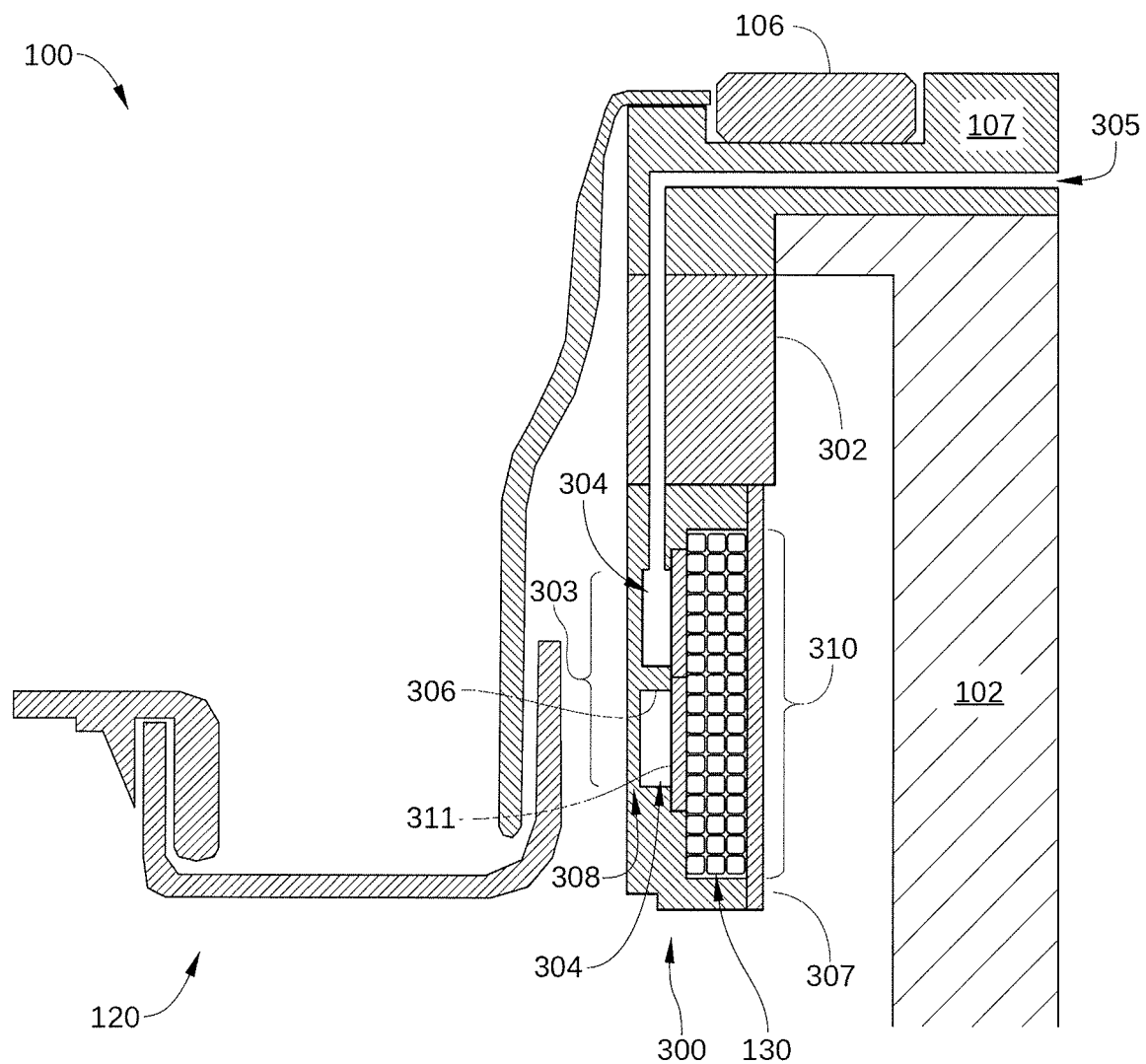
FIG. 3 is a schematic cross-sectional illustration of a coil portion of an electromagnet and an associated annular structure that enables cooling of the coil portion via a cooling liquid, according to various embodiments of the present disclosure.

FIG. 3 is a schematic partial cross-sectional illustration of coil portion 130 and an associated annular structure 300 that enables cooling of coil portion 130 via a cooling liquid, according to various embodiments of the present disclosure. In the embodiment illustrated in FIG. 3, coil portion 130 is mounted on a surface of or positioned inside annular structure 300, which is disposed within PVD chamber 100.

Annular structure 300 is a substantially annulus-shaped structure that is disposed proximate deposition shields 120 and outside processing region 105. In FIG. 3, a cross-section of only one portion of annular structure 300 is shown, but annular structure 300 extends around the circumference of deposition shields 120. As shown, annular structure 300 is disposed between chamber walls 102 and deposition shields 120. In the embodiment illustrated in FIG. 3, annular structure 300 is coupled to and suspended below adapter 107 by one or more pylons 302. In such embodiments, the one or more pylons can each be configured as a machined part of adapter 107 or can be a separately assembled part that is coupled to adapter 107. Alternatively, annular structure 300 can be suspended in PVD chamber 100 using one or more supports coupled to inner surfaces of chamber walls 102.

Annular structure 300 includes at least one conduit 303 for transmission of a cooling liquid within annular structure 300 and a cavity 310 in which coil portion 130 is disposed. In the embodiment illustrated in FIG. 3, conduit 303 includes multiple channels 304 that are separated from each other by a divider 306. Alternatively, conduit 303 includes three or more channels 304. In some embodiments, each of channels 304 is fluidly coupled to a supply conduit 305 that is formed within one of pylons 302 and to a return conduit (not shown) that is also formed within one of pylons 302. Supply conduit 305 and the return conduit are then fluidly coupled to a cooling liquid recirculating system, such as a pump and heat exchanger. Alternatively, in some embodiments one of channels 304 is fluidly coupled to supply conduit 305 and the other of channels 304 is fluidly coupled to the return conduit. In such embodiments, the flow of cooling liquid in one of channels 304 can be arranged to flow in one direction around annular structure 300 and in an opposite direction in the other of channels 304, thereby distributing cooling more evenly around the circumference of annular structure 300.

In some embodiments, coil portion 130 is disposed in cavity 310, which is fluidly separated from conduit 303 by a cover 311. Cover 311 can one or more welded metal strips that seal cavity 310 from conduit 303 and are partially supported by and welded to divider 306. For example, cover 311 can be configured of two distinct pieces, thus including a separate piece to cover each of channels 304, so that cover 311 is less likely to flex or otherwise deflect when undergoing stresses associated with thermal cycling. In some embodiments, cavity 310 is fluidly separated from the vacuum-containing portion of PVD chamber 100 by a cover plate 307. Thus, in such embodiments, cavity 310 is separated from the vacuum in the PVD chamber 100 when vacuum is present in PVD chamber 100, and may, for example be maintained at a different pressure than the pressure in the sputtering chamber, for example atmospheric or above atmospheric pressure, to enhance conductive heat transfer therefrom into annular structure 300 and thus into any coolant flowing in the conduit 303.

Conduit 303 is fluidly separated from the vacuum-containing portion of PVD chamber 100, for example by a cover plate (not shown) or by a portion 308 of annular structure 300. In the embodiment illustrated in FIG. 3, portion 308 of annular structure 300 fluidly separates conduit 303 from the vacuum-containing portion of PVD chamber 100. As a result, there are two welds separating cooling liquid in conduit 303 from the vacuum-containing portion of PVD chamber 100: the weld sealing conduit 303 from cavity 310 and the weld sealing cavity 310 from the vacuum-containing portion of PVD chamber 100. Therefore, the failure of two welds must occur before cooling liquid in conduit 303 can leak into the vacuum-containing portion of PVD chamber 100. Alternatively, in some embodiments, some or all of annular structure 300 is formed via a 3D printing process. In such embodiments, conduit 303 can be formed without a separately welded cover 311, which further reduces the potential for leakage of the cooling liquid from conduit 303.

In the embodiment illustrated in FIG. 3, coil portion 130 includes wire or other conductors that are substantially square in cross-section. Alternatively, in other embodiments, coil portion 130 can include conductors that are circular or rectangular in cross-section.

Figure 4:
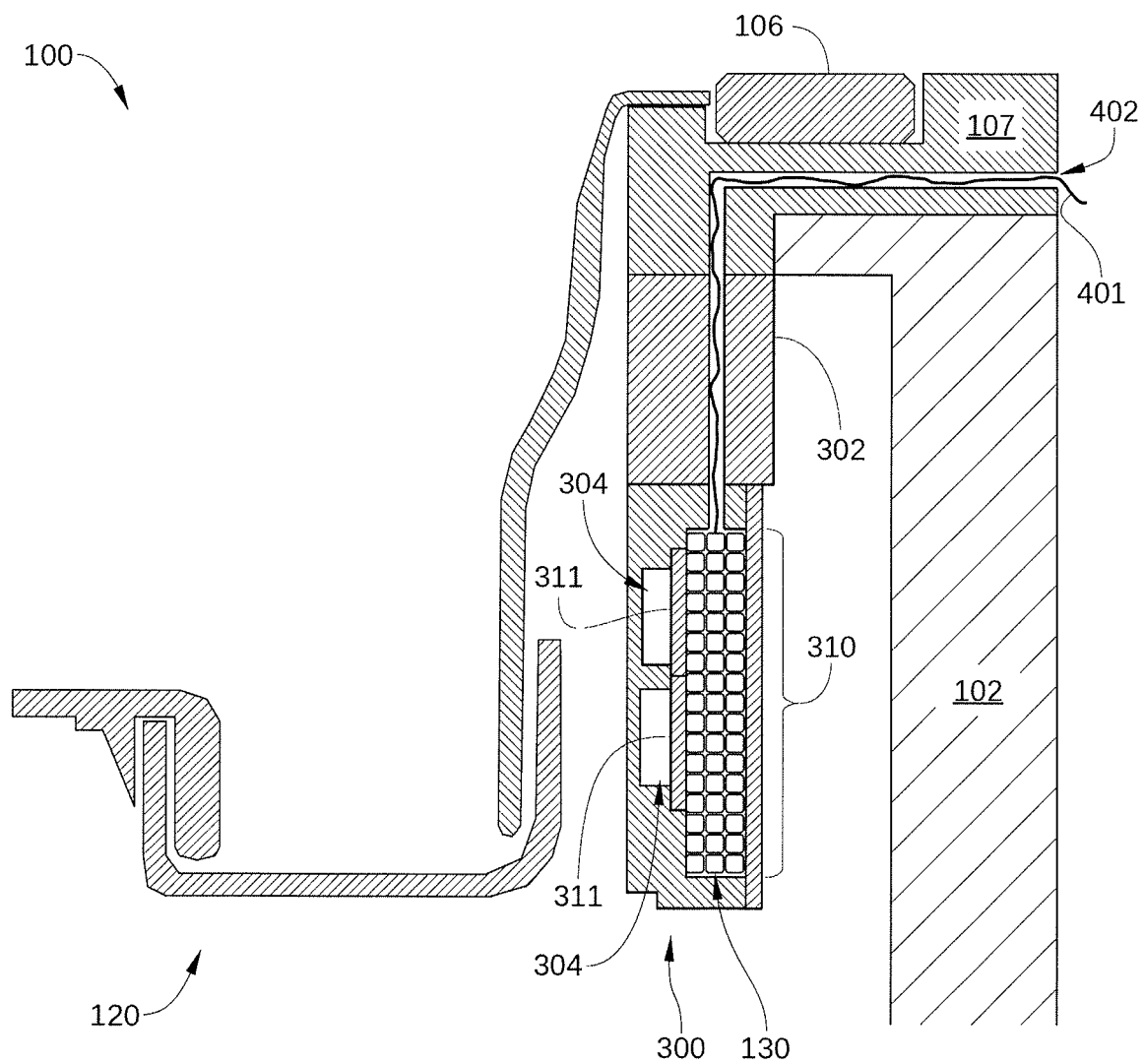
FIG. 4 is a schematic cross-sectional illustration of a coil portion of an electromagnet and an electrical lead connected thereto, according to embodiments of the present disclosure.

In some embodiments, cavity 310 is exposed to atmosphere, even though cavity 310 is disposed within PVD chamber 100. One such embodiment is illustrated in FIG. 4. FIG. 4 is a schematic cross-sectional illustration of coil portion 130 and an electrical lead 401 connected thereto, according to embodiments of the present disclosure, taken at a section other than the section of FIG. 3. Also shown in FIG. 4 is a channel 402 through which electrical lead 401 passes from coil portion 130 to DC power source 155. For clarity, only a single electrical lead 401 is depicted in FIG. 4, but generally two electrical power connections run between coil portion 130 and DC power source 155 so that current can be flowed through the wires of the coil portion 130 and around the substrate support 103. As shown, channel 402 is formed in adapter 107 and one of pylons 302. Thus, channel 402 enables electrical connection of coil portion 130 through adapter 107 and the pylon 302. In the embodiment illustrated in FIG. 4, channel 402 is at atmospheric pressure and is fluidly coupled to cavity 310. As a result, cavity 310 is also at atmospheric pressure. Consequently, leakage of cooling liquid around cover 311 from either of channels 304 will cause cavity 310 to fill and then overflow outside of PVD chamber 100, which can be readily detected, and heat transfer between the wires of the coil portion 130 and the annular structure 300 is enhanced as compared to where the coil portion 130 is in vacuum.

In some embodiments, coil portion 130 includes two separately powered coils that are configured to generate magnetic fields with opposing poles. That is, the north pole of the magnetic field generated by the first separately powered coil is positioned adjacent to the south pole of the magnetic field generated by the second separately powered coil. One such embodiment is illustrated in FIG. 5.

Figure 5:
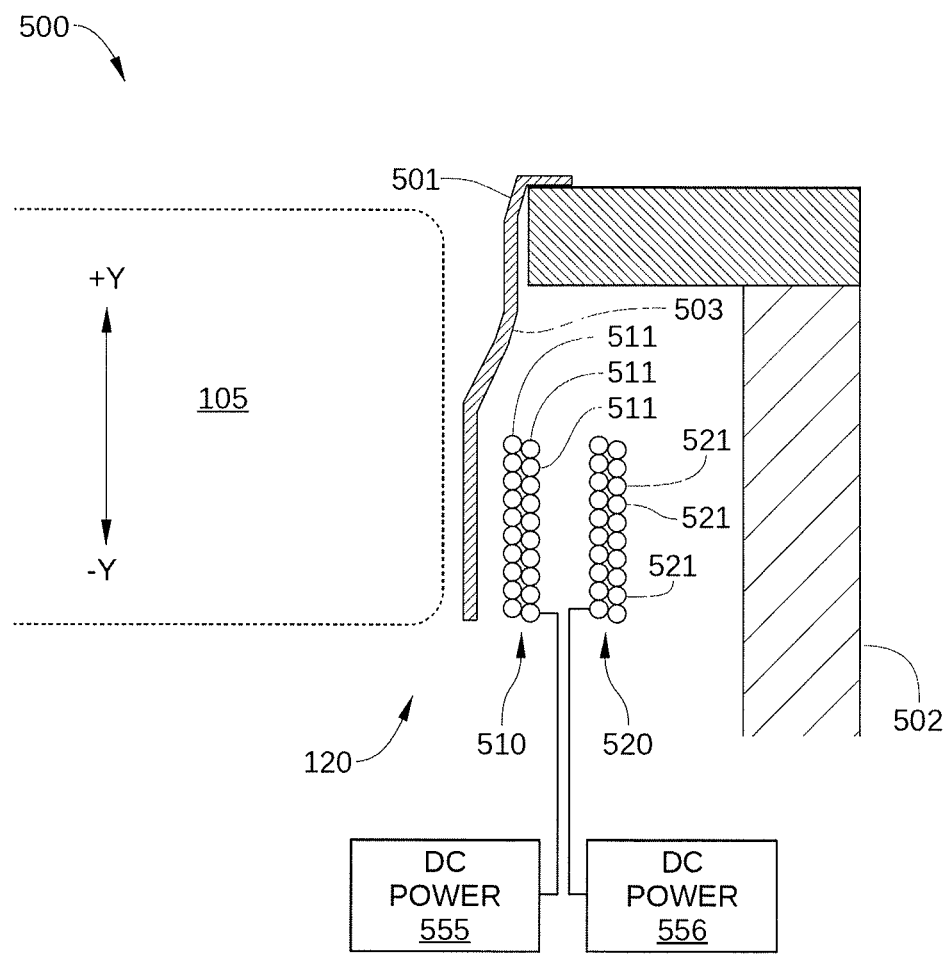
FIG. 5 schematically illustrates adjacent portions of two separately powered coils disposed within a PVD chamber, according to an embodiment of the present disclosure.

FIG. 5 schematically illustrates adjacent portions of two separately powered coils 510 and 520 disposed within a PVD chamber 500, according to an embodiment of the present disclosure. Similar to previously described embodiments, coils 510 and 520 are disposed within PVD chamber 500 and outside of processing region 105, for example between an outer surface 503 of a deposition shield 501 and a chamber wall 502 of PVD chamber 500. In some embodiments, coil 510 and coil 520 are separately powered, that is, each can be electrically coupled to a different respective DC power source. Thus, coil 510 is coupled to a first DC power source 555 and coil 510 is coupled to a second DC power source 556.

As a result of coil 510 and coil 520 being powered separately, the polarity of coil 510 can be opposite that of coil 520. For example, when DC current is applied to coil 510 so that the DC current flows into the page in FIG. 5 at each cross-section 511 of coil 510, the north pole of the electromagnet that includes coil 510 is in the +Y direction. Further, when DC current is applied to coil 520 so that the DC current flows out the page in FIG. 5 from each cross-section 521 of coil 520, the north pole of the electromagnet that includes coil 520 is in the −Y direction. Therefore, modulation of the current flowing through coil 520 can generate changes in the shape and intensity of the magnetic field generated by the electromagnet that includes coil 510. As noted previously, changes to the shape and intensity of the magnetic field in processing region 105 directly affects deposition rate of material on a substrate in PVD chamber 500 in the edge region of the substrate.

In FIG. 5, coil 510 and coil 520 are shown physically separated from each other. In other embodiments, coil 510 and coil 520 can be in physical contact with each other, but are electrically insulated from each other, for example with an insulative coating therebetween. Thus, in some embodiments, coil 510 and coil 520 can each be disposed in a single cavity in an annular structure, such as cavity 310 in FIG. 3. Alternatively, in some embodiments, coil 510 and/or coil 520 is formed as a thin film deposited on a surface of deposition shield 501.

Figure 6:
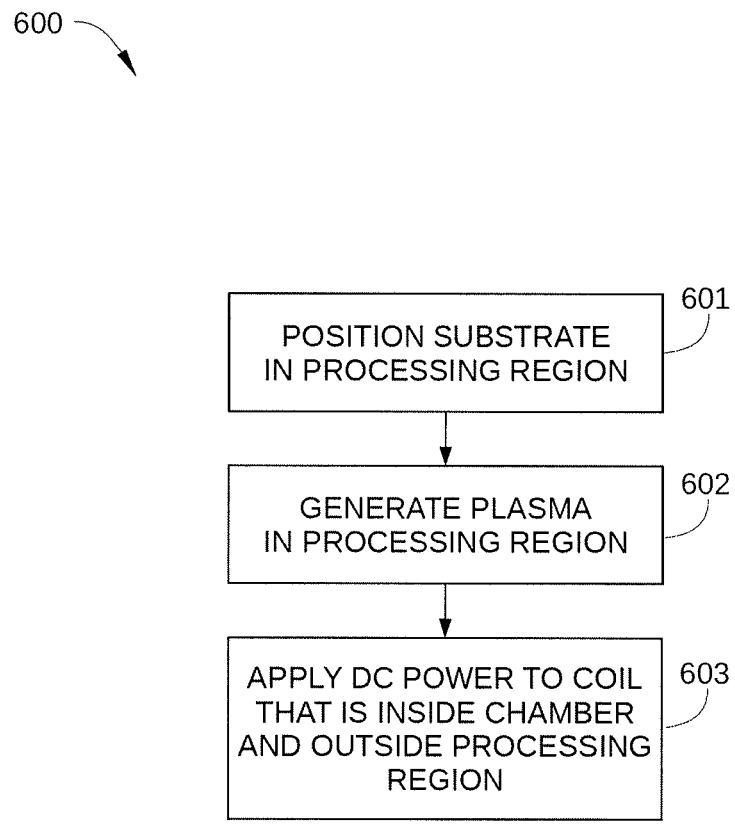
FIG. 6 is a flow chart of process steps for depositing a film on a substrate via a PVD process, according to various embodiments of the disclosure.

FIG. 6 is a flow chart of process steps for depositing a film on a substrate using a PVD process, according to various embodiments of the disclosure. Although the method steps are described in conjunction with the PVD chambers illustrated in FIGS. 1-5, persons skilled in the art will understand that the method steps may be performed with any suitably configured deposition system.

A method 600 begins in step 601, in which substrate 101 is positioned in processing region 105 of PVD chamber 100. For example, in some embodiments, a controller associated with PVD chamber 100 or a system that includes PVD chamber 100 causes substrate 101 to be placed on substrate support 103. The controller then causes substrate support 103 to be raised to a processing position proximate processing region 105.

In step 602, the controller causes plasma to be generated in processing region 105 as part of a PVD process. For example, the controller causes gas source 153 to introduce one or more process gases into PVD chamber 100 and DC power source 154 to apply DC power to sputtering target 110.

In step 603, while the plasma is present in processing region 105, the controller causes DC power source 155 to apply DC power to coil portion 130, thereby modifying the magnetic field within processing region 105. In some embodiments, in step 603 a cooling liquid is also flowed through channels of an annular structure on which coil portion 130 is mounted. In such embodiments, the flow of the cooling liquid can be continuous, i.e., the flow of cooling liquid continues when plasma is not present in processing region 105.

In the embodiment described above, plasma is first generated in processing region 105, then DC power is applied to coil portion 130. In alternative embodiments, DC power is applied to coil portion 130 prior to or coincident with the initial generation of plasma in processing region 105.

Implementation of method 600 enables a PVD process in which thickness uniformity of a material deposited on substrate 101 can be modified without redesign of one or more components within the PVD chamber. That is, the application of DC power to coil portion 130 provides one or more additional process tuning parameters for tuning the thickness uniformity of a PVD-deposited film. In particular, center-to-edge thickness uniformity issues can be addressed by increasing or decreasing the DC power applied through coil portion 130, changing the polarity of power applied to coil portion 130, and/or changing a time-variable profile of power applied to coil portion 130.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

While the foregoing is directed to embodiments of the present disclosure, other and further embodiments of the disclosure may be devised without departing from the basic scope thereof, and the scope thereof is determined by the claims that follow.

What is claimed is:

1. A physical vapor deposition (PVD) system, comprising:
   a vacuum processing chamber comprising:
   a sputtering target;
   a substrate support disposed within the vacuum processing chamber configured to position a substrate proximate to the sputtering target;
   a deposition shield disposed within the vacuum processing chamber;
   a processing region disposed within the vacuum processing chamber and bounded by a surface of the target, a surface of the substrate support, and an inner surface of the deposition shield;
   a coil portion of an electromagnet, wherein the coil portion is disposed within the vacuum processing chamber and outside the processing region;
   an annular structure on which the coil portion is disposed, wherein the annular structure is disposed within the vacuum processing chamber and outside of the processing region, wherein the coil portion and a cooling channel are disposed in a cavity formed in the annular structure, and wherein the cooling channel is sealed from the coiled portion; and
   a cover plate that fluidly separates the coil portion from a vacuum containing portion of the vacuum processing chamber.

2. The PVD system of claim 1, wherein the cooling channel is configured for flowing of a cooling liquid within the annular structure.

3. The PVD system of claim 2, wherein the annular structure is coupled to a body of the vacuum processing chamber via multiple pylons, and the cooling channel is fluidly coupled to a supply conduit formed within at least one of the multiple pylons and to a return conduit formed within at least one of the multiple pylons.

4. The PVD system of claim 2, wherein the cooling channel includes multiple channels that are fluidly separated from each other by a divider.

5. The PVD system of claim 4, wherein the divider is configured to support a water cover that fluidly separates the coil from the conduit.

6. The PVD system of claim 2, wherein the portion of the annular structure that includes the conduit is formed via a 3D printing process.

7. The PVD system of claim 1, wherein the cavity is fluidly coupled to atmosphere exteriorly of the vacuum processing chamber during processing of substrates within the vacuum processing chamber.

8. The PVD system of claim 1, wherein the annular structure is coupled to a body of the vacuum processing chamber via multiple pylons.

9. The PVD system of claim 1, wherein the deposition shield is coupled to the coil portion.

10. The PVD system of claim 9, wherein the deposition shield is coupled to an outer surface of the coil portion.

11. The PVD system of claim 1, further comprising a direct current (DC) power supply coupled to the coil portion.

12. The PVD system of claim 11, wherein the DC power supply comprises one of a programmable power supply configured to generate a variable DC output in response to a command selecting an output profile or a controllable power supply configured to generate a variable DC output in response to an input value.

13. The PVD system of claim 1, further comprising an additional coil portion of an additional electromagnet, wherein the additional coil portion is disposed within the vacuum processing chamber and outside the processing region.

14. The PVD system of claim 13, wherein the coil portion is coupled to a first DC power supply and the additional coil portion us coupled to a second DC power supply.

15. A method of physical vapor deposition in a vacuum chamber, the method comprising:
positioning a substrate in a processing region of the vacuum chamber, wherein the processing region is disposed between a surface of a sputtering target of the vacuum chamber, a surface of a substrate support in the vacuum chamber, and an inner surface of a deposition shield disposed in the vacuum chamber;
generating a plasma in a processing region; and
when the plasma is present in the processing region, applying direct current (DC) power to a coil portion of an electromagnet, wherein the coil portion is disposed within the vacuum chamber and outside the processing region, wherein the coil portion and a cooling channel are disposed in a cavity formed in an annular structure disposed in the vacuum chamber and outside the processing region, wherein the cooling channel is sealed from the coiled portion, and wherein a cover plate fluidly separates the coil portion from a vacuum containing portion in the vacuum chamber.

16. The method of claim 15, further comprising, when the plasma is present in the processing region, supplying a cooling liquid to the cooling channel disposed within the annular structure.

17. The method of claim 15, wherein applying the DC power to the coil portion comprises applying pulsed DC power to the coil portion from a variable output DC power source.

18. The PVD system of claim 8, wherein the annular structure is coupled to an adapter via the multiple pylons and the adapter is coupled to the body of the vacuum processing chamber.

19. The PVD system of claim 8, wherein the annular structure further comprises a channel configured to fluidly couple a portion of the cavity that houses the coiled portion with a region external to the chamber.

* * * * *